United States Patent
Arevalo

[19]

[11] Patent Number: 6,091,302
[45] Date of Patent: Jul. 18, 2000

[54] ELECTRONIC CIRCUIT BIASING CONTROL SYSTEM

[75] Inventor: Augusto Arevalo, Miami, Fla.

[73] Assignee: AmerAmp, LLC, Carlsbad, Calif.

[21] Appl. No.: 09/046,239

[22] Filed: Mar. 23, 1998

[51] Int. Cl.[7] .................................................. H03G 3/30
[52] U.S. Cl. ..................... 330/296; 330/289; 330/277; 330/290; 330/278
[58] Field of Search .................................. 330/289, 296, 330/277, 290, 278

[56] References Cited

U.S. PATENT DOCUMENTS

| | | | |
|---|---|---|---|
| 5,177,453 | 1/1993 | Russell et al. ........................... | 330/289 |
| 5,488,331 | 1/1996 | Keane et al. ............................ | 330/296 |

*Primary Examiner*—Michael B Shingleton
*Attorney, Agent, or Firm*—Gray Cary Ware Freidenrich

[57] ABSTRACT

A biasing and monitoring system for use with a circuit. The system comprises a biasing device, which is coupled to the circuit and which biases a circuit variable; and a monitoring device, which monitors a first indicator variable, and which comprises means for communicating information about the first indicator variable; and a controlling device. The controlling device controls the biasing device, receives information about the first indicator variable, is coupled to the biasing device and to the monitoring device, and comprises means for determining a desired value for the circuit variable.

The system can be implemented in an amplifier system comprising a field effect transistor ("FET"). The system biases the gate voltage of the FET so as to minimize the intermodulation products for any given value of temperature. The system uses a look-up table to determine the proper biasing voltage, and desired source current, for any given temperature.

4 Claims, 2 Drawing Sheets

ELECTRONIC CIRCUIT BIASING CONTROL SYSTEM

CROSS-REFERENCE TO RELATED APPLICATIONS

Not applicable.

BACKGROUND OF THE INVENTION

1. Field of the Invention

The invention disclosed broadly relates to biasing and monitoring systems, and more particularly relates to biasing a field effect transistor ("FET") through the use of a look-up table to achieve optimal distortion levels despite a changing temperature.

2. Description of the Related Art

In typical circuits that require the biasing of a circuit element, the circuit is simply designed for a given temperature and the circuit elements are biased accordingly. The temperature that is designed for may be the preferred operating temperature, the worst case, or some other value. When the temperature fluctuates, however, the bias levels do not, and therefore the circuit might be performing suboptimally much of the time. The same condition can occur for any circuit whose performance is dependent upon another variable, for example other environmental variables such as pressure and humidity, or circuit variables themselves, such as power, distortion, voltage, etc. The common problem is that for any given value of temperature (or some other variable), their is an optimal value for the bias level, but the bias level cannot be changed easily because the circuit design does not provide for it.

In circuits containing FETs, for example, it is desirable to bias each FET such that the intermodulation products are minimized. The proper value of drain-to-source current to achieve this minimization, however, is a function of the temperature. Thus, although the optimal current can always be determined, typical circuits are only designed to provide one value which corresponds to one temperature.

Accordingly, there is a need for a biasing and monitoring system which overcomes these problems.

SUMMARY OF THE INVENTION

Briefly, in accordance with the invention, there is provided a biasing and monitoring system for use with a circuit. The system comprises a biasing device, which is coupled to the circuit and which biases a circuit variable; and a monitoring device, which monitors a first indicator variable, and which comprises means for communicating information about the first indicator variable; and a controlling device. The controlling device controls the biasing device, receives information about the first indicator variable, is coupled to the biasing device and to the monitoring device, and comprises means for determining a desired value for the circuit variable.

The system can be implemented in an amplifier system comprising a field effect transistor ("FET"). The system biases the gate voltage of the FET so as to minimize the intermodulation products for any given value of temperature. The system uses a look-up table to determine the proper biasing voltage, and desired source current, for any given temperature.

DETAILED DESCRIPTION OF AN EMBODIMENT

Figure 1:
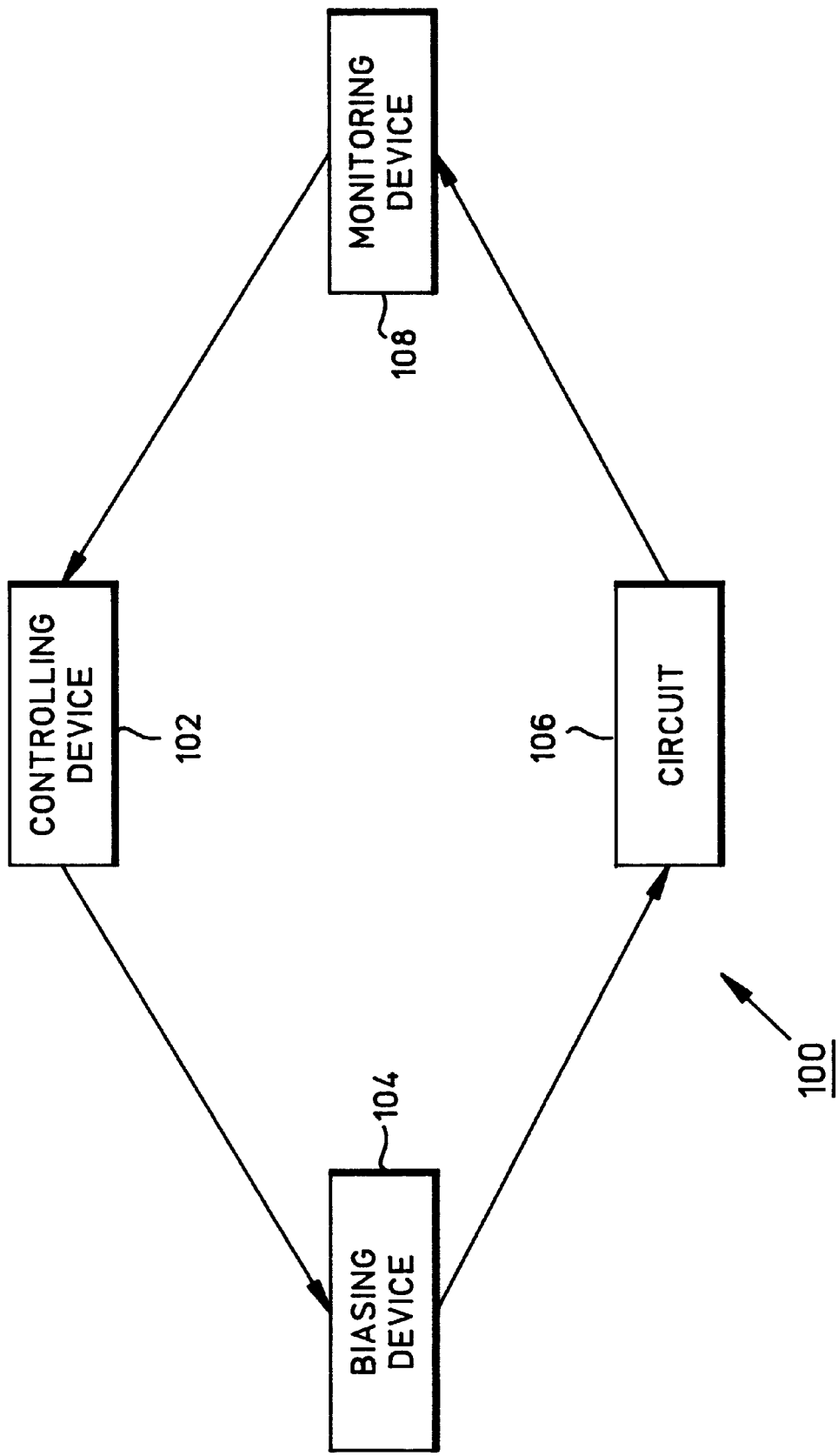
FIG. 1 is a high-level block diagram of a biasing and monitoring system according to the present invention.

Referring to FIG. 1, there is shown a high-level block diagram of a biasing and monitoring system according to the present invention 100 which shows a solution to the problem described above. In the diagram 100, the circuit 106 can be biased at different levels by the biasing device 104. The controlling device 102 and the monitoring device 108 are used to determine what the proper biasing level should be at any given time.

Figure 2:
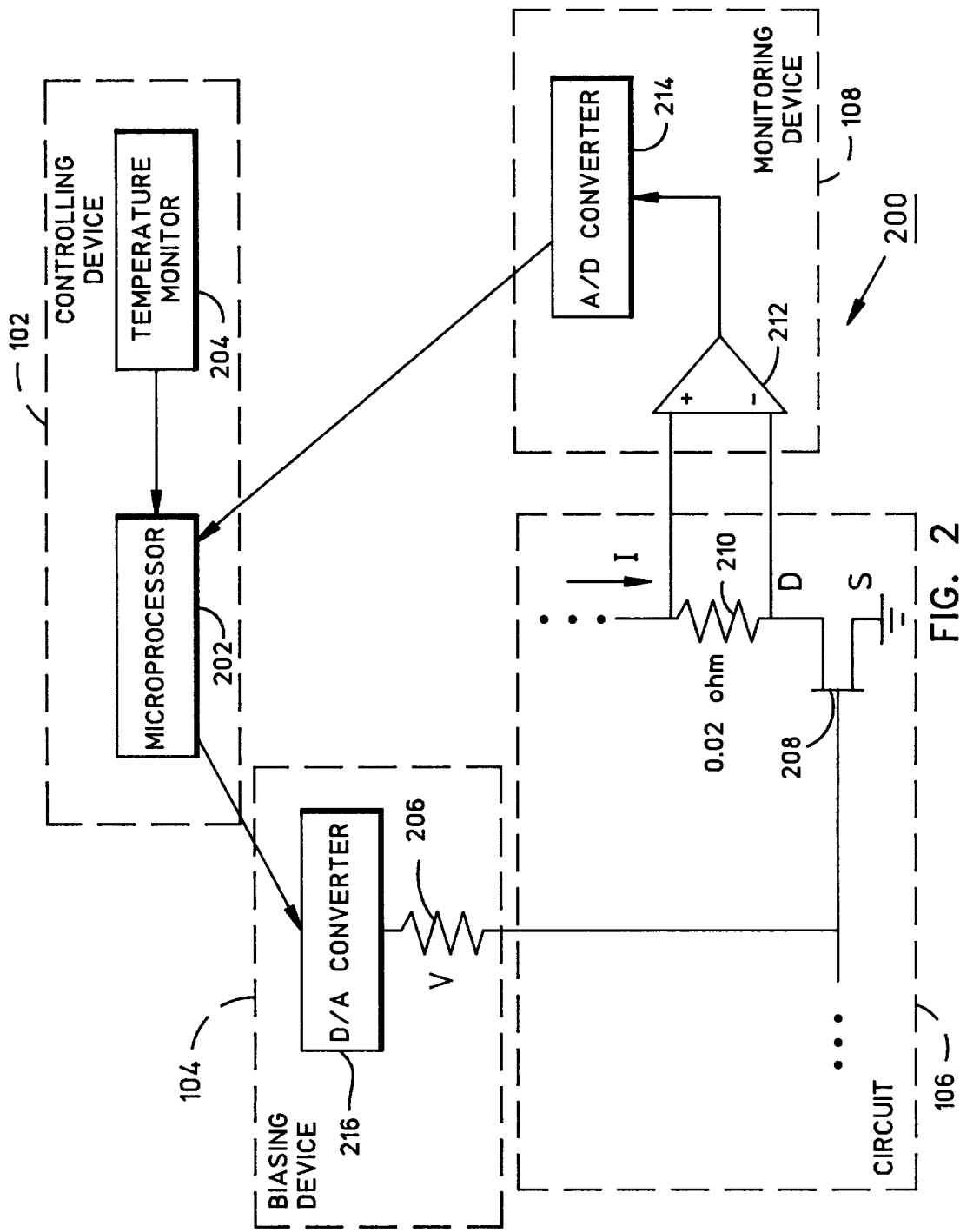
FIG. 2 is a biasing and monitoring system according to the present invention.

The system 200 of FIG. 2 shows a more detailed diagram for the case of biasing a FET 208. As stated earlier, the optimal current for a given temperature can be determined. This optimal value can be achieved through the proper biasing of the gate voltage of the FET 208. The microcomputer 202 accomplishes this by sending the proper input to the D/A converter 216, which applies the voltage to the FET 208 through the resistor 206. The gate voltage, in turn, determines the current that runs through the FET 208 from drain to source. The system 200 could operate without any feedback, because of the predictable relationship between the biasing voltage and the current. In this case, however, the operational amplifier ("op-amp") 212 and the A/D converter 214 send the value of the current to the microprocessor 202. This is done by measuring the voltage across the small resistor 210, and then applying Ohm's Law (V=IR). This information can be valuable as the FET, or any other component, ages, allowing the microcomputer 202 to refine the biasing voltage in order to produce the exact current desired.

The microcomputer 202 uses the value of the temperature, which is supplied to it by the temperature monitor 204, to determine what the proper biasing voltage and desired current are. A table containing these values of voltage and current, along with the corresponding temperatures for which they are the optimal operating point, is stored in the microcomputer 202.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A biasing and monitoring system for use with a circuit, the system comprising:

a biasing device, for coupling to the circuit and for biasing a circuit variable, the circuit variable comprising at least one of a circuit voltage and a circuit current;

a monitoring device, for coupling to the circuit and for monitoring a first indicator variable, comprising means for communicating information about the first indicator variable;

a memory storing a look-up table containing values corresponding to the biasing circuit variable associated with values that correspond to ambient temperatures in the environment in which the circuit operates;

a controlling device, electrically coupled to the memory, the biasing device, and the monitoring device, the controlling device comprising:

means for controlling the biasing device to provide at least one of a biasing circuit voltage and a biasing circuit current to the circuit based on values contained in the look-up table;

means for receiving information about the first indicator variable;

means for coupling to the biasing device and to the monitoring device; and means for determining a desired value for the circuit variable by performing a look-up in the look-up table for an ambient temperature in the environment in which the circuit operates, and the controlling means in response thereto controlling the biasing device to provide at least one of a desired biasing circuit voltage and a desired biasing circuit current to the circuit.

2. The system of claim 1, wherein:

the controlling device further comprises means for monitoring a second indicator variable, wherein the second indicator variable comprises an indication of an ambient temperature in the environment in which the circuit operates; and the means for determining a desired value for the circuit variable comprises means for determining a desired value for the circuit variable based on the value of the first indicator variable and on the value of the second indicator variable indication of an ambient temperature value that is look-ed up in the look-up table stored in the memory.

3. The system of claim 2 wherein:

the biasing device comprises a digital-to-analog converter;

the monitoring device comprises an operational amplifier ("op-amp") and an analog-to-digital converter ("A/D"), wherein the op-amp is coupled to the A/D;

the second indicator variable is the ambient temperature in the environment in which the circuit operates;

the controlling device comprises a microprocessor and a temperature monitor, wherein means for monitoring a second indicator variable comprises the temperature monitor and the temperature monitor is coupled to the microprocessor; and means for determining the desired value for the circuit variable based on the value of the first indicator variable and the value of the second indicator variable comprises a look-up table that associates values of the first indicator variable and the second indicator variable with corresponding values of the circuit variable.

4. An amplifier system comprising:

a field effect transistor ("FET");

a digital-to-analog converter ("D/A"), coupled to the FET, wherein the D/A biases the gate voltage of the FET;

a monitoring device, coupled to the FET, comprising an analog-to-digital converter ("A/D") and an operational amplifier ("op-amp"), wherein the A/D is coupled to the op-amp, the op-amp is coupled to the FET, and the op-amp measures the drain current of the FET;

a temperature monitor; and a microprocessor, electrically coupled to the D/A, the A/D, and the temperature monitor, and wherein the microprocessor comprises a look-up table stored therein and containing values corresponding to desired circuit parameters associated to values corresponding to different temperatures, and wherein the microprocessor, based on a temperature being indicated by the temperature monitor, looks-up a value in the look-up table that corresponds to the indicated temperature, and controls the D/A to bias the gate voltage of the FET to a desired biasing voltage based on the value corresponding to the desired circuit parameters that is associated to the looked-up value corresponding to the indicated temperature.

* * * * *